United States Patent [19]

Sieber et al.

[11] 4,030,092

[45] June 14, 1977

[54] DIGITAL TO ANALOG CONVERTER USING RECIRCULATING SHIFT REGISTER

[75] Inventors: Paul Sieber, Heilbronn; Joachim Kuhlmann, Heilbronn-Bockingen, both of Germany

[73] Assignee: Licentia Patent-Verwaltungs-G.m.b.H., Frankfurt am Main, Germany

[22] Filed: Aug. 13, 1974

[21] Appl. No.: 497,082

[30] Foreign Application Priority Data

Sept. 18, 1973 Germany .......................... 2348831

[52] U.S. Cl. ....................................... 340/347 DA
[51] Int. Cl.$^2$ ....................................... H03K 13/02
[58] Field of Search ........ 340/347 DA; 235/92 NT, 235/92 SH, 152, 164, 183, 197; 328/37, 127, 164, 14; 307/246, 264

[56] References Cited

UNITED STATES PATENTS

| | | |
|---|---|---|
| 3,388,241 | 6/1968 | Isaacs ................................. 235/168 |
| 3,543,009 | 11/1970 | Voelcker, Jr. .................. 235/150.4 |
| 3,553,685 | 1/1971 | Tatsuzawa et al. ................ 340/347 |
| 3,581,116 | 5/1971 | Leostic ............................... 307/264 |
| 3,811,038 | 5/1974 | Reddaway ......................... 235/152 |
| 3,822,380 | 7/1974 | Forgione ........................... 328/14 X |
| 3,831,167 | 8/1974 | Tewksbury .................. 340/347 DA |

OTHER PUBLICATIONS

Croisier, "IBM Technical Disclosure Bulletin," vol. 15, No. 7, Dec., 1972, pp. 2050–2051.
Soanes, "Electronic Engineering," June, 1956, p. 247.
Laurich, "IBM Technical Disclosure Bulletin," vol. 13, No. 7, Dec., 1970, pp. 1865–1866.

*Primary Examiner*—Charles D. Miller
*Attorney, Agent, or Firm*—Spencer & Kaye

[57] ABSTRACT

A circuit for a digital/analog converter comprising a shift register whose contents correspond to a value of an electrical magnitude, a control logic unit for controlling the shift register and an integration element for integrating the contents of the shift register to produce the value of the electrical magnitude.

9 Claims, 1 Drawing Figure

U.S. Patent
June 14, 1977
4,030,092
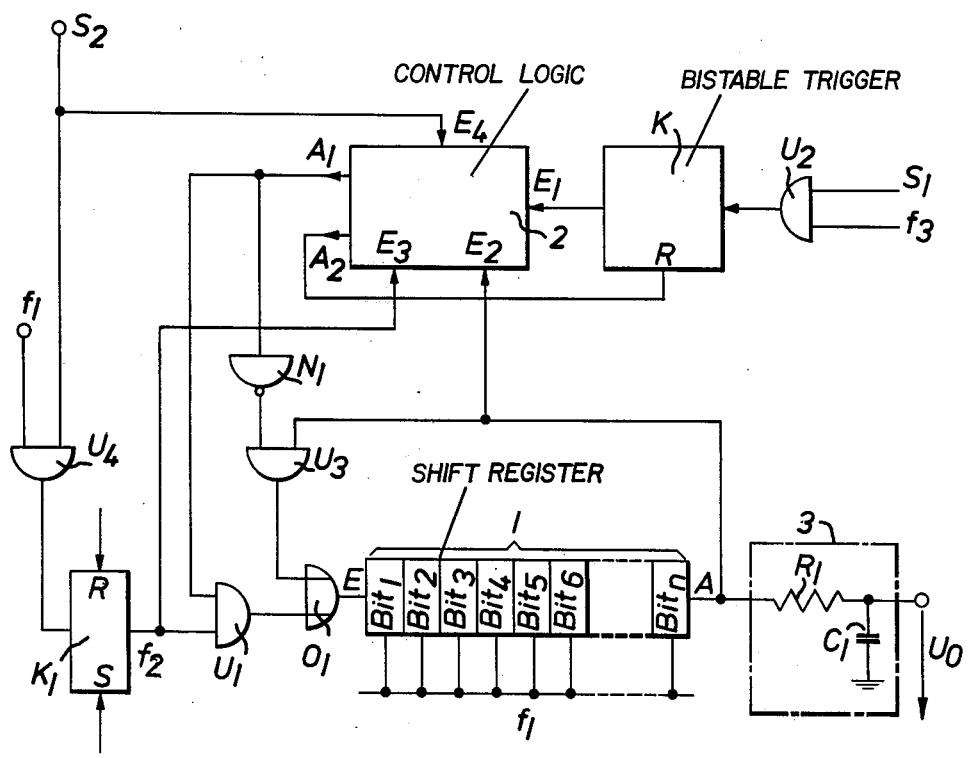

DIGITAL TO ANALOG CONVERTER USING RECIRCULATING SHIFT REGISTER

BACKGROUND OF THE INVENTION

In the construction of electrical equipment, efforts are increasingly being made to replace the hitherto used mechanical components, such as switches, push buttons and rotary potentiometers, by electronic components which are controlled by means of a digital data flow. When using digital technology, the disturbance-free transmission of the data, a simple indicator facility and the realizability of the necessary circuits in monolithic integrated semiconductor technology are ensured.

The invention relates to a circuit for an analog/ digital converter with which the digital information corresponding to the electrical magnitude is converted into an associated and variable value of this electrical magnitude.

Such a circuit is necessary, for example, if a potentiometer necessary for the control of direct voltage levels is to be replaced by a digital/analog circuit. Such digital/analog converters are required for example in order to vary setting values on radios, televisions and tape recorders. In the case of a television, for example, the brightness, the color saturation and the loudness are adjusted by means of variable direct voltge levels.

Already several circuits have been proposed by which the conventional potentiometers can be replaced.

In the case of such a circuit, one piece of binary information corresponding to a direct voltage magnitude is written into a binary coded counter with weighted counter stages. A weighted resistance is connected after each counter stage, which all operate on a common summing resistance. The currents flowing in the weighted resistances according to the counter state are added up at the summing resistance so that a direct voltage corresponding to the counter state drops across this resistance. This circuit has the disadvantage that the accuracy of the resistance used determines the accuracy of the output voltage.

In the case of another known circuit, the information is converted over the desired voltage level into a binary word corresponding to this value. The individual places of this binary word are in each case written into a storage element associated with each place. The content of all the storage elements is interrogated through a resistance network, wherein the resistance value of each element is weighted corresponding to the appropriate place value of the cell associated with the resistance value. The currents flowing and weighted in the individual resistances according to the element content are then added in a common summing resistance connected thereafter and across which a direct voltage corresponding to the binary word thus drops.

This circuit also has the disadvantage that the accuracy of the output direct voltage is dependent on the accuracy of the resistance network. Moreover a circuit must be present in which the binary word corresponding to the desired voltage value is formed. For example a specified time is converted into a binary word corresponding to the time value, for producing the binary word.

In the case of a third known circuit, again a binary word is written into the storage cells associated with the places of the binary word. The binary word corresponds to the desired direct voltage. The binary word is now compared in a comparator with the contents of a continuously circulating counter. The place number of the counter must in this case correspond with the place number of the binary word. The counter thus changes its contents with a relatively high frequency, switches back to zero and begins to count again if the counter has reached the highest possible storable number. In the zero axis crossing of the counter, a bistable trigger stage connected to the comparator is so set that a voltage appears at its output. The bistable trigger stage is then reset by the comparator if the counter content coincides with the binary word. The pulse sequence leaving the output of the bistable trigger stage is fed to an integrator. Since the relationship of the time in which a voltage occurs at the bistable trigger stage output, to the time in which the output voltage of the bistable trigger stage is zero, corresponds to the binary word and thus to the desired direct voltage, the integrator emits this direct voltage value correctly and independently of the resistance values. However, a large electronic expenditure, by which makes the equipment very expensive, is required for the construction of this circuit.

SUMMARY OF THE INVENTION

It is an object of the invention to provide a digital-/analog converter which is simply constructed and thus can be produced cheaply and in which simultaneously the output magnitude is independent of a resistance network.

According to a first aspect of the invention, there is provided a circuit for a digital/analog converter comprising a shift register for storing a value related to a value of an electrical magnitude, a control logic unit for write in, read out or change of contents of said shift register and an integration element connected after an output of said shift register for producing the value of said electrical magnitude by integration of the contents of said shift register.

According to a second aspect of the invention, there is provided a circuit for a digital/analog converter, comprising a shift register the content of which corresponds to a defined value of an electrical magnitude, a control logic unit by which the content of said shift register is written in, received or changed, and an integration element connected after the output of said shift register, the value of the electrical magnitude being produced by said integration element by integration of the register content.

BRIEF DESCRIPTION OF THE DRAWINGS

The invention, will now be described in greater detail, by way of example, with reference to the drawing, the single FIGURE of which is a circuit diagram of one embodiment of the invention.

DESCRIPTION OF THE PREFERRED EMBODIMENT

Basically, the invention proposes that, in the case of the circuit for a digital/analog converter, a shift register is provided, the content of which corresponds to a defined value of an electrical magnitude, a control logic unit is present by which the content of the shift register is written in, retained or varied and an integration element is connected after the output of the shift register, with which integration element the value of the electrical magnitude is produced by integration of the register content.

The principle upon which the invention is based rests on the fact that the electrical magnitude, for example a direct voltage, results from the integration of a continuously circulating shift register content. The direct voltage which can be tapped off at the integration element is directly proportional to the number of logic "ones" contained in the shift register. The resolution, i.e. the subdivisibility of the electrical magnitude which can be tapped off at the integrator, is alone dependent on the length of the shift register or on the number of the binary values to be accommodated in the shift register. The output magnitude at the integrator and the possible resolution of this magnitude can be easily obtained from formulae. In the case of a direct voltage, the following apply:

Output voltage $\quad U_o = \frac{m}{n} \cdot U_B$

Resolution $\quad U_o = \frac{1}{n} \cdot U_B$ wherein $n$ gives the number of the bits of the shift register and $m$ characterizes the number of the logic "ones" contained in the shift register in one cycle. $U_B$ is the level voltage corresponding to a logic "one".

The content of the shift register to be integrated is thus given from the relationship of the logic "ones" present in toto in the register to the logic "zero" values present in toto. The output of the shift register is fed back to the input of the shift register so that the register content can continuously circulate with the help of a shift timing pulse.

The circuit in accordance with the invention permits different operations. Thus means may be provided by which an alternating sequence of logic "zero" and "one" values are written into the shift register. This is necessary in order to be able to adjust the output voltage to a mean value.

During the operation of a television receiver for example, it is desired that, on switching on the set, all the adjustable magnitudes such as brightness, volume and color saturation be adjusted to a mean value. This is effected by the writing in of the variably alternating "one" – "zero" series. An integration of this series yields, with an even number of bits in the shift register, an output voltage of the magnitude $U_o = 0.5 \cdot U_B$ wherein UB is the level voltage, which corresponds to a logic "one". The alternating "zero" – "one" is written in with the help of a first trigger stage.

Further means must be provided by which the number of the logic "zero" or "one" values contained in the shift register can be varied if the output direct voltage is to be increased or reduced. A second trigger stage causes binary values in the shift register to be converted into another value during the duration of an input signal. In this case it is determined by the setting of the first trigger stage whether "0" values are converted into "one" values or vice versa "one" values are to be converted into "zero" values. Since the variation command is fed from outside the logic unit independently of the register content, a completely irregular bit pattern which is similar to the bit pattern produced in a random generator, results in the shift register.

Referring now to the drawing, a shift register is given the reference numeral 1 and has $n$ bits. The register output A is connected by means of a logic unit to the register input E so that the register content continuously circulates. The shift timing pulse necessary for this, has, for example, a frequency $f_1$ of 200 KHz. Connected to the output A of the shift register is an integration element 3, which comprises, for example a resistance $R_1$ and a capacitance $C_1$. Then the direct voltage $U_o$ corresponding to the register content is taken off at the capacitance. The control logic unit is given the reference numeral 2. It contains a logic unit built up with the known linked modules, which unit fulfills functions still to be described. Such a control logic unit can be realized without difficulty and therefore does not have to be described in any further detail.

The logic unit $U_3$ connected between the output A and the input E of the shift register prevents a circulation of the shift register content during the writing in of the "zero" – "one" series. Such a logic unit is necessary when an OR-element is connected in front of the input of the shift register.

A first AND-element $U_1$ which is connected, by means of the OR-element $O_1$ connected thereafter, to the input E of the shift register, is connected to a first bistable trigger stage $K_1$. The second input electrode of the AND-element $U_1$ is connected to the output $A_1$ of the control logic unit 2. A logic "one" occurs at this output $A_1$ when writing in and when changing the register content. To the input of the trigger stage $K_1$ is connected an AND-element $U_4$, to the one input of which is applied a timing frequency and the other input of which is provided for the application of a start signal $S_2$. The timing frequency at the input of the AND-circuit $U_4$ preferably corresponds to the shift timing frequency $f_1$. The start signal is also fed to the control logic unit ($E_4$) in order to trigger the correct output signal at $A_1$ of the control logic unit.

The second input of the OR-element $O_1$ is connected to the output of an AND-element $U_3$, one input of which is connected by means of a negator element $N_1$ to the output $A_1$ of the control logic unit. The other input of the AND-element $U_3$ is connected to the output A of the shift register.

A second bistable trigger stage $K_2$ is connected by its output to the input $E_1$ of the control logic unit 2. It provides, in the case of an input signal $S_i$ present at the AND-circuit $U_2$ connected in front of it, for one binary value in the shift register to be converted into the other value appearing at the output of the first trigger stage $K_1$ when the first binary value capable of conversion running from A to E of the shift register appears.

The circuit functions as follows:

On actuation of the start signal $S_2$, the timing frequency $f_1$ is fed by means of the AND-circuit $U_4$ to the input of the bistable trigger stage $K_1$. Then a pulse sequence, the frequency of which is halved relative to that of $f_1$, appears at the output of $K_1$. The start signal $S_2$ is also fed into the control logic unit 2, whereupon a logic "one" is set up at the output $A_1$ of the control logic unit. Thus the pulse sequence arrives and passes unhindered from the output of $K_1$ by way of the AND-circuit $U_1$ and the OR-circuit $O_1$ to the input E of the shift register 1. Since the shift timing frequency $f_1$ is twice as large as the frequency $f_2$ of the pulse sequence at the input E of the shift register, an alternating "zero" – "one" series is written into the shift register. At the output of the negator element $N_1$ a logic "zero" appears, so that the AND-circuit $U_3$ is continuously blocked and the circulated "ones" coming from the output A of the shift register are not fed again to the input E. At the end of the start signal the information at the output $A_1$ of the control logic unit changes into a logic "zero". The AND-element $U_1$ is blocked by this, whereas the input to the AND-element $U_3$, which is connected to $A_1$ via negator $N_1$, is provided with logic "one" input information. Thus the AND-element $U_3$ is released for the circulation of information from the shift register, which information now passes to the input E from the output A by way of the OR-element $O_1$.

A change in the register content is triggered by means of the start signal $S_1$ at the AND-element $U_2$. At the same time the trigger stage $K_1$ is so set that, at its output, information occurs, which is to be written into one or more storage cells of the shift register instead of the other hitherto present binary information.

If for example R=1 and S=0 are set at the trigger stage $K_1$, a "zero" appears at the output of the trigger stage. This means that one or more "ones" in the shift register are to be replaced by this "zero". In the case of R=0 and S=1 there appears at the output of the trigger stage a logic "one", which is to replace the "0" values contained in the register.

In the case of an actuation of the start signal $S_1$ and of a desired setting of the trigger stage $K_1$, a timing signal with the frequency $f_3$ is applied to the input of the trigger stage $K_2$ by way of the switched-through AND-gate $U_2$. The frequency $f_3$ is, for example, no greater than the $n$ th part of the shift timing frequency $f_1$ (i.e., $f/n$ where $n$ = bit number of the register). In this way, at most, one value in the shift register is changed per register cycle.

When the start signal $S_1$ is present, the trigger stage $K_2$ emits a pulse sequence to the input of the control logic unit. At the same time the circulating information of the shift register is interrogated by means of the input $E_2$ of the control logic unit. At the moment at which the first information capable of change circulates, a logic "one" appears at the output $A_1$ of the control logic unit. This logic "one" releases the AND-element $U_1$ so that the information occurring at the output of $K_1$ can pass to the input E of the shift register by way of the OR-element $O_1$. A circulating logic "one" is, if a logic "zero" is to be written in its place, blocked off by the AND-gate $U_3$ so that the "zero" occurring at the output of the AND-element $U_1$ is written in. After the conversion of the first information capable of being converted, the trigger stage $K_2$ is reset over the feedback line by the control logic unit output $A_2$ so that a further change in the shift register can be undertaken again only by means of the next pulse. On setting back the trigger stages $K_2$, there appears again at the output $A_1$ of the control logic unit a logic "0", which releases the circulation of the shift register content and blocks the AND-element $U_1$. The conversion of a "0" into a "1" is effected in the same way.

The circuit described can comprise bipolar components or components which are built up according to the known MOS technology. When using MOS transistors, constructional groups operated both statically and by timing pulses, i.e., dynamically can be used.

The circuit in accordance with the invention can be used particularly economically if a plurality of shift registers with the associated electronics are connected to one control logic unit. For example the brightness, volume and color saturation of a television set can be adjusted by a plurality of shift registers by means of the common control logic unit. Each of these magnitudes is associated with the integrated and variable content of a shift register. In addition to the already named possibilities of use, the circuit in accordance with the invention can also be used for the control of an automatic transmission cycle, for the control of servomotors or for the brightness control of lamps.

It will be understood that the above description of the present invention is susceptible to various modifications changes and adaptations.

What is claimed is:

1. A digital/analog converter circuit for setting and varying electrical values comprising, in combination:

a shift register whose binary content corresponds to a defined value of an electrical parameter with the value of the electrical parameter being the ratio of the total number of logic "one" values in the register to the total number of logic "zero" values in the register;

a feedback line connected between the output and the input of said shift register;

means for continuously applying shift clock pulses of a first frequency to said shift register to cause the normally continuous circulation of the data in said register via said feedback line;

a logic circuit means for initially writing an alternating sequence of logic "zero" and logic "one" values, corresponding to the defined average of an electrical value, into said shift register and for thereafter selectively varying the ratio of the logic "one" and logic "zero" values circulating in said shift register to vary the digital content, said logic circuit means having a control logic means, and a means for changing the number of logic "zero" or one values contained in said shift register including: a first trigger stage for selectively providing a logic "one" or "zero" value at its output; a logic unit, which is controlled by said control logic means, connected between the output of said first trigger stage and the input of said shift register; and a second trigger stage triggered by means of an input logic unit, which second trigger stage is connected to the input of said control logic means to control same when an input signal is present at said input logic unit; said control logic means being responsive to a single from said second trigger stage to trigger said logic unit to cause the conversion of the first circulating logic value in said shift register which is capable of conversion into the logic value appearing at the output of said first trigger stage;

and an analog integrating means connected to said output of said shift register for continuously integrating the signals appearing at said output of said shift register to continuously provide an output voltage whose magnitude corresponds to the digital content of said shift register.

2. A circuit as defined in claim 1, wherein said feedback line of said shift register is connected to said control logic means and said control logic means is connected to said second trigger stage in such a manner that said second trigger stage is reset after the conversion of the stored value.

3. A circuit as defined in claim 1, wherein the timing frequency of the input signal selected for the operation of said second trigger stage is not greater than the $n$ th.

part of said first frequency, wherein $n$ corresponds to the number of bits of information contained in said shift register, so that at most, one value in said shift register is changed per register cycle.

4. A circuit as defined in claim 3, wherein $n$ is even-numbered.

5. A circuit as defined in claim 1, wherein said logic circuit means includes first means for supplying a pulse sequence ($f_2$), whose frequency is half as large as said first frequency, to the input of said shift register during the writing-in of said alternating sequence of logic "zero" and logic "one" values.

6. A circuit as defined in claim 6, wherein said logic circuit means includes means for preventing the circulation of the contents of said shift register during the writing-in of said alternating sequence of logic "zero" and logic "one" values.

7. A circuit as defined in claim 5, wherein: said first means includes means for selectively applying a pulse sequence with said first frequency to an input of said first trigger stage ($K_1$) to cause same to emit a pulse sequence with a frequency half of said first frequency; and said logic unit is a first AND-element having one input connected to the output of said first trigger stage and its output connected, by means of an OR-element, to said input of said shift register, the second input of said first AND-element being connected to the output of said control logic unit, which output emits a logic "one" during the writing-in and changing of the register content.

8. A circuit as defined in claim 7, further comprising a second AND-element connected in said feedback line; and wherein the second input electrode of said OR-element, is connected to the output of said second AND-element, one input of said second AND-element is connected by way of a negator element likewise to said output of said control logic unit, whereas the other input of said second AND-element is connected to the output of said shift register.

9. A circuit as defined in claim 1, wherein said output voltage is a direct voltage.

* * * * *

UNITED STATES PATENT AND TRADEMARK OFFICE
CERTIFICATE OF CORRECTION

PATENT NO. : 4,030,092
DATED : June 14th, 1977
INVENTOR(S) : Paul Sieber et al

It is certified that error appears in the above-identified patent and that said Letters Patent are hereby corrected as shown below:

In the heading of the patent, under [30] Foreign Application Priority Data, change "Sept. 18, 1973, to --Sept. 28, 1973--.

Column 2, line 22, delete "by".

Column 3, line 50, change "$U_o = 05 \cdot U_B$ to --$U_o = 0.5 \cdot U_B$--; line 52, change "UB" to --$U_B$--.

Column 5, line 33, change "f/n" to --$f_1/n$--; line 55, change "stages" to --stage--.

Column 6, line 37, change "one" to --"one"--; last line, delete the period after "th".

Column 7, line 13, change "6" to --1--.

Signed and Sealed this

Twenty-fifth Day of October 1977

[SEAL]

Attest:

RUTH C. MASON
Attesting Officer

LUTRELLE F. PARKER
Acting Commissioner of Patents and Trademarks